(12) United States Patent
Wu et al.

(10) Patent No.: US 12,225,685 B1
(45) Date of Patent: Feb. 11, 2025

(54) GAME CONSOLE STORAGE BASE

(71) Applicant: Jinhong Wu, Guangdong (CN)

(72) Inventors: Jinhong Wu, Guangdong (CN); Dewen Zeng, Guangdong (CN)

(73) Assignee: Jinhong Wu, Guangdong (CN)

( * ) Notice: Subject to any disclaimer, the term of this patent is extended or adjusted under 35 U.S.C. 154(b) by 0 days.

(21) Appl. No.: 18/649,956

(22) Filed: Apr. 29, 2024

(30) Foreign Application Priority Data

Oct. 20, 2023 (CN) .......................... 202322833052

(51) Int. Cl.
*H05K 7/20* (2006.01)
*A63F 13/95* (2014.01)
*G06F 1/20* (2006.01)

(52) U.S. Cl.
CPC ......... *H05K 7/20209* (2013.01); *A63F 13/95* (2014.09); *G06F 1/203* (2013.01); *G06F 1/206* (2013.01); *H05K 7/20145* (2013.01)

(58) Field of Classification Search
CPC  H05K 7/20209; H05K 7/20145; A63F 13/95; G06F 1/203; G06F 1/206
USPC ........................................................ 700/299
See application file for complete search history.

(56) References Cited

U.S. PATENT DOCUMENTS

| | | | | |
|---|---|---|---|---|
| 7,038,909 B1* | 5/2006 | Chen | ....................... | G06F 1/203 361/679.48 |
| 2003/0005201 A1* | 1/2003 | Olson | ..................... | G06F 1/203 710/303 |
| 2004/0261422 A1* | 12/2004 | McEuen | ................... | G06F 1/20 62/3.2 |
| 2009/0135557 A1* | 5/2009 | Mok | ..................... | G06F 1/1632 361/679.41 |
| 2014/0055623 A1* | 2/2014 | Okada | .................. | H04N 23/634 348/177 |
| 2017/0331302 A1* | 11/2017 | Namiki | ................. | H01M 10/46 |
| 2024/0025235 A1* | 1/2024 | Morrison | ........... | B60H 1/00385 |

FOREIGN PATENT DOCUMENTS

| | | | | |
|---|---|---|---|---|
| CN | 201524405 U | * | 7/2010 | |
| CN | 111077950 A | * | 4/2020 | |
| GB | 2524248 A | * | 9/2015 | ........... G06F 1/1626 |

OTHER PUBLICATIONS

S. Petite et.al., "Best Prime Day PS5 Deals—Get PlayStation Exclusives For Lowest Prices", https://www.gamespot.com/gallery/prime-day-2023-ps5-game-deals/2900-4794/, Jul. 12, 2023 (Year: 2023).*

* cited by examiner

*Primary Examiner* — Thomas C Lee
*Assistant Examiner* — Michael Tang
(74) *Attorney, Agent, or Firm* — ScienBiziP, P.C.

(57) ABSTRACT

A game console storage base configured to store a game console and dissipate heat from the game console, wherein the game console storage base comprises: a housing configured to accommodate the game console and comprising an air inlet, wherein the air inlet is configured to facilitate dissipating heat from the game console into an interior of the housing; at least one heat dissipation fan arranged in the interior of the housing, wherein the at least one heat dissipation fan discharges heat from the interior of the housing to an external of the housing; at least one temperature sensor configured to sense a temperature of the game console; and a control circuit connected to the at least one temperature sensor and the at least one heat dissipation fan.

18 Claims, 13 Drawing Sheets

GAME CONSOLE STORAGE BASE

TECHNICAL FIELD

The instant disclosure relates to a game console storage base, in particular to a game console storage base configured to dissipate heat on a game console.

BACKGROUND

Game machines are entertainment and relaxation devices which are very popular with consumers. Due to a high integration level of game machines, processors generate a large amount of heat when large games are running by the processors. Although mainstream game machines are designed with heat dissipation functions, however, when games are actually being played, the gaming experience may still decline due to untimely heat dissipation of consoles.

A heat dissipation device in which a fan is installed at a position close to a heat dissipation port is provided in the prior art. Such a technical solution has some limitations such as: heat dissipation may still be insufficient if the fan has a low speed, and noise is generated if the fan is at a high speed.

An indirect heat dissipation solution based on a heat transfer medium is further proposed in the prior art, in which heat from a game machine is received by a medium with high thermal conductivity or the heat is received by a refrigerating medium, and then the heat is guided away from the transfer medium by a fan. Such a solution also has some limitations for household game consoles such as: the cost may be increased if the volume of the heat transfer medium is enlarged, on the other hand, the efficiency of heat dissipation will be reduced if the volume of the heat transfer medium is reduced.

SUMMARY OF DISCLOSURE

The present disclosure provides a game console storage base, thereby the heat dissipation efficiency of the game console storage base can be adjusted according to actual heat generation of the game console.

In one aspect, embodiments of the disclosure provide a game console storage base, which comprises:

In another aspect, embodiments of the disclosure further provide a game console storage base, which configured to store a game console and dissipate heat from the game console, wherein the game console storage base comprises: a housing configured to accommodate the game console and comprising an air inlet, wherein the air inlet is configured to facilitate dissipating heat from the game console into an interior of the housing; at least one heat dissipation fan arranged in the interior of the housing, wherein the at least one heat dissipation fan discharges heat from the interior of the housing to an external of the housing; at least one temperature sensor configured to sense a temperature of the game console; and a control circuit connected to the at least one temperature sensor and the at least one heat dissipation fan.

DETAILED DESCRIPTION

Figure 1:
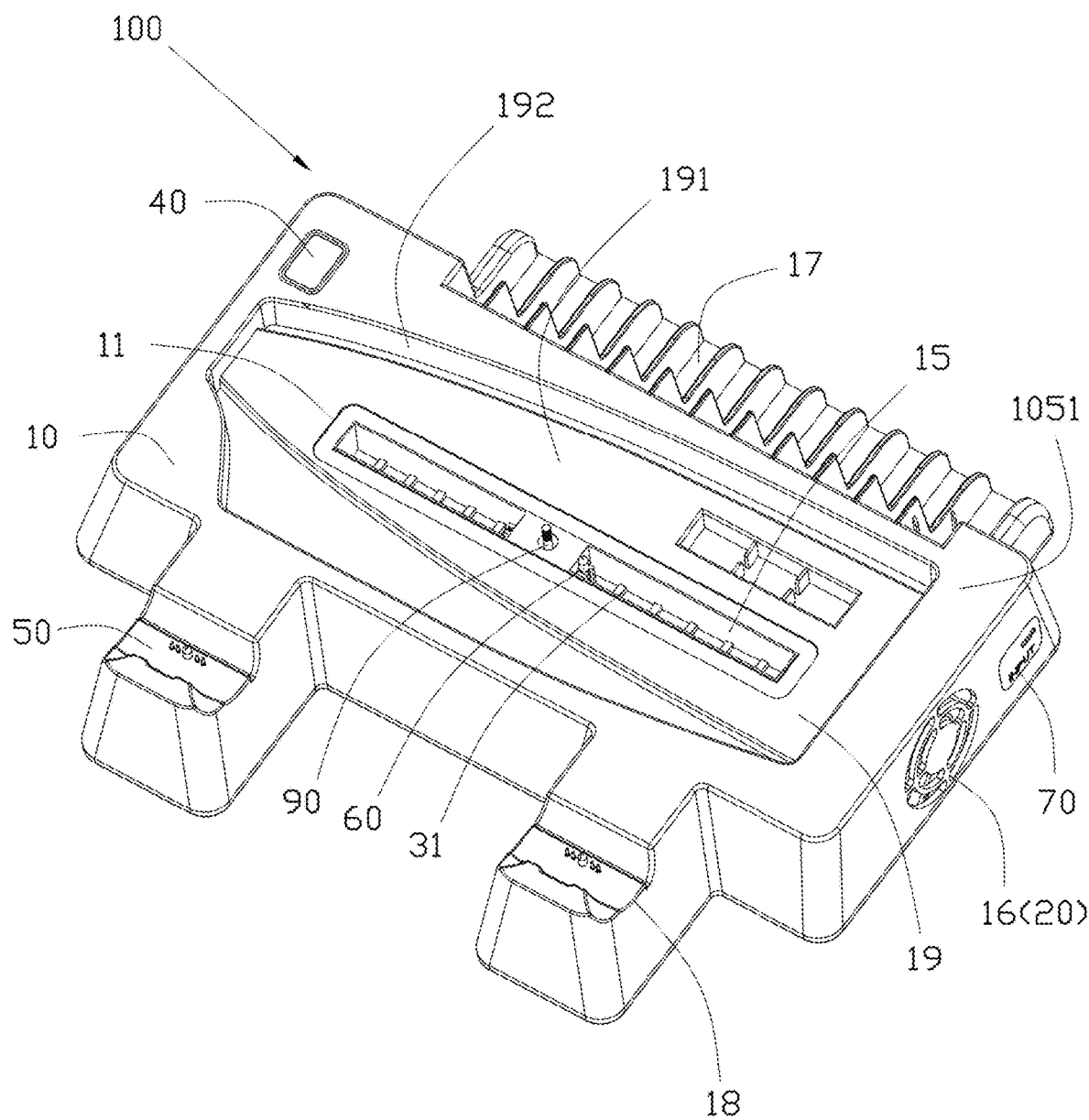
FIG. 1 is a schematic three-dimensional diagram showing a first embodiment of a game console storage base according to the present disclosure.

The present disclosure provides a game console storage base 100 adapted to storing and cooling a game console 200 and configured to charge a handle controller (not shown in the figures) of a game machine. Specific configuration of a game console storage base 100 of each embodiment is described in detail below.

First Embodiment

Referring to FIGS. 1 to 4, the configuration of a game console storage base 100 of the present embodiment is described in detail. The game console storage base 100 of the present embodiment includes a housing 10, and a heat dissipation unit 109, a temperature sensor 60 and a control circuit 80 which are installed on the housing 10.

Figure 2:
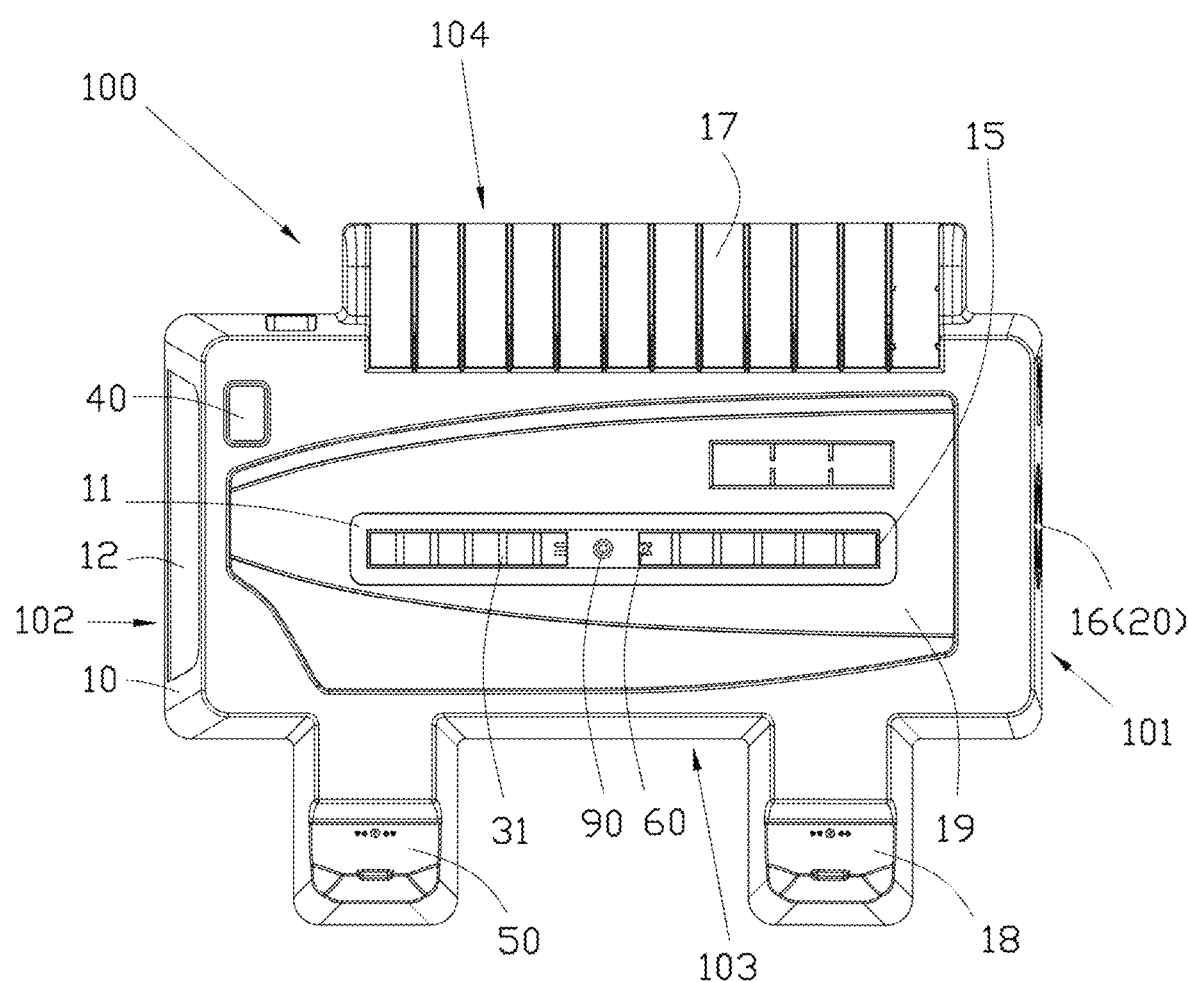
FIG. 2 is a schematic top view of the first embodiment of the game console storage base according to the present disclosure.

As shown in FIGS. 1 and 2, the housing 10 is roughly in a shape of a long box, and is enclosed and formed by a top surface 105 and a bottom surface 106 which are opposite to each other (refer to FIGS. 3, 5 and 6) and four side surfaces 101-104. On the top surface 105 of the housing 10, an accommodation groove 19 is formed in an inwardly recessed manner, to store the game console 200. The accommodation groove 19 includes a bottom wall 191 and a side wall 192 connected with the bottom wall 191, and the side wall 192 of the accommodation groove 19 is connected with a groove outer wall 1051 of a region outside of the accommodation groove 19 in the top surface 105 of the housing 10. The recessed shape of the accommodation groove 19 is matched with the contour of an end surface on one side of the game console 200, so that the game console 200 is clamped by the bottom wall 191 and the side wall 192. In addition, not limited thereto, the shape of the accommodation groove 19 can be changed according to the contour of the game console 200.

The heat dissipation unit 109 is arranged on the housing 10 and is configured to dissipate heat from the game console 200. In the present embodiment, the heat dissipation unit 109 includes a first fan 20 and a heat dissipation channel 21.

The heat dissipation channel 21 is formed by communicating an air inlet 15 and an air outlet 16 which are formed on the housing 10. The air inlet 15 is formed by penetrating through the bottom wall 191 of the accommodation groove 19 at the accommodation groove 19, and the air inlet 15 is communicated with a heat dissipation surface of the game console 200, to allow entrance of heat from the game console 200 into the heat dissipation channel 21 inside the game console storage base 100. In addition, the number of openings of the air inlet 15 can be multiple, and can be set appropriately according to actual needs. The air outlet 16 penetrates through a first side surface 101 of the plurality of side surfaces 101-104 connected with the top surface 105 of the housing 10. The air outlet 16 communicates to the exterior and is communicated with the air inlet 15, such that the heat dissipation channel 21 communicating the air inlet 15 and the air outlet 16 is formed inside the housing 10. Therefore, heat exhausted out of the game console 200 is brought in from the air inlet 15 by the first fan 20 (hereafter also called a heat dissipation fan) to form airstreams (also called hot air) 301 in the heat dissipation channel 21, and the hot air 301 is discharged from the air outlet 16 under the drive of the airstreams 302 formed by the fan 20. Directions of the airstreams 302 is kept consistent relative to directions of hot air 301 exhausted out of the game console, as a result, the first fan 20 discharges heat from the interior of the housing 10 to an external of the housing 10. Therefore, heat dissipated by the game console 200 can be carried away quickly and the game console is cooled efficiently. In addition, preferably, at least part of the heat dissipation channel 21 is formed as a cavity, such that heat can be carried away without interfering with the flow of the airs.

The temperature sensor 60 can be arranged in the air inlet 15 at the accommodation groove 19 of the housing 10 as shown in FIG. 1, so that the temperature sensor 60 contacts or is close to the heat dissipation surface, which dissipates heat, of the game console 200. Preferably, the temperature sensor 60 can be configured in a manner of partially protruding from the air inlet 15, so that the temperature sensor 60 is closer to the heat dissipation surface or directly contacts the heat dissipation surface of the game console 200, and thus can detect the temperature of the heat dissipation surface of the game console 200 at a high accuracy.

The control circuit 80 is arranged on the housing 10 and is connected with the temperature sensor 60 and the first fan 20 to receive temperature values fed back by the temperature sensor 60, and controls operation of the first fan 20 and adjusts the rotational speed of the first fan 20. The temperature sensor 60 monitors, in real time, heat dissipation temperature of the game console, to provide a basis for heat dissipation control of the game console. The control circuit 80 can be configured as follows: for example, a first threshold indicating overheating of the game console 200 can be set. In the case where the fan is not turned on, when the temperature sensor 60 detects that the temperature reaches or exceeds the first threshold, the control circuit 80 enables the first fan 20 to operate to cool the game console 200. In addition, in the case where the first fan 20 is turned on, when the temperature sensor 60 detects that the temperature reaches or exceeds the first threshold, the control circuit 80 increases the rotational speed of the first fan 20, thereby improving the heat dissipation effect. Moreover, a second threshold indicating that heat dissipation of the game console 200 is acceptable can also be set. When the temperature sensor 60 detects that the temperature is lower than the second threshold, the control circuit 80 lowers the air speed of the first fan 20 or turns off the first fan, and the air speed of the first fan 20 is adjusted with the heat dissipation temperature of the game console 200 as a reference, such that noise generated due to excessive operation of the first fan 20 can be suppressed, and therefore, the user experience is improved while the heat dissipation effect is not influenced. In other examples, adjustment of the rotational speed of the fan can be independent from the setting of the temperature threshold, in other words, replacing an automatic adjustment method based on temperature thresholds, manual adjustment can be performed.

In the present embodiment, according to the above configuration, the heat dissipation efficiency of the game console storage base 100 can be adjusted according to actual heat generation of the game console 200, and the first fan 20 is operated at a proper rotational speed, such that noise generated due to excessive operation of the first fan 20 can be suppressed while a sufficient heat dissipation effect is ensured, and the user experience is better.

In addition, the game console storage base 100 of the present embodiment can further include a display part 40. The display part 40 is connected with the control circuit 80, and the control circuit 80 is connected with one or more temperature sensors 60. The temperature sensor 60 detects a temperature value, and the temperature value detected by the temperature sensor 60 can be displayed by the display part 40 connected with the control circuit 80. The display part 40 may be a display device, for example, a digital tube, a liquid crystal display or a projector. In addition, the configuration of the present application is not limited thereto, and the display part 40 may also be an indicator light. For example, temperature degree information may also be denoted by using a gear indicated by the indicator light. In addition, the configuration of the present application is not limited thereto, and the above information may be displayed in the same display part 40, and may also be separately displayed in different display parts. In addition, the configuration of the present application is not limited thereto, and a display part 40 having both a display screen and an indication part may also be used. Such a display part 40 having both a display screen and an indication part can be formed integrally or separately. For example, the housing includes a display screen 40 on one surface, and includes an indication part on another surface.

In addition, the game console storage base 100 can also be further provided with an adjustment part, for example, a button, configured to adjust the air speed, and a switch button of the first fan 20 and other operation parts operated by a user with instructions for controlling fans (including the first to the fourth fans 20, 22, 24, 26), and a part 12 can also be configured to include a button and other operation parts. For example, in examples as shown in FIG. 2, etc., the game console storage base 100 includes a display part 40, and a part 12 displaying information different from that displayed by the display part 40. The display part 40 is arranged on the top surface 105, and the control circuit 80 is connected with the display part 40 and the temperature sensor 60. Based on the temperature detected by the temperature sensor 60, the display part 40 displays the value of the temperature. The part 12 is arranged on the second side surface 102, and the part 12 is connected with the control circuit 80 and the first fan 20 to control and display the rotational speed of the fan. The positions of the display part 40 and the part 12 are not limited thereto and can be set according to actual needs.

In addition, in the game console storage base 100, the bottom surface 106 can also include a radiation fin 13. By providing the radiation fin 13, the radiation fin 13 preferably including a material with excellent thermal conductivity, the heat radiation effect can be improved. The entire bottom surface 106 of the housing 10 may be constituted by the radiation fin 13. However, it can be understood that, in the present disclosure, part of the bottom surface may be constituted by the radiation fin 13, the specific shape of which is not limited, and the radiation fin 13 may also be omitted.

In addition, in the case where the heat dissipation channel 21 of the housing 10 is formed to be relatively large, air easily diffuses around, and cannot quickly carry heat out of the air outlet 16 via the first fan 20, such that heat is accumulated in the internal space, and the heat dissipation effect will be influenced over time.

Figure 3:
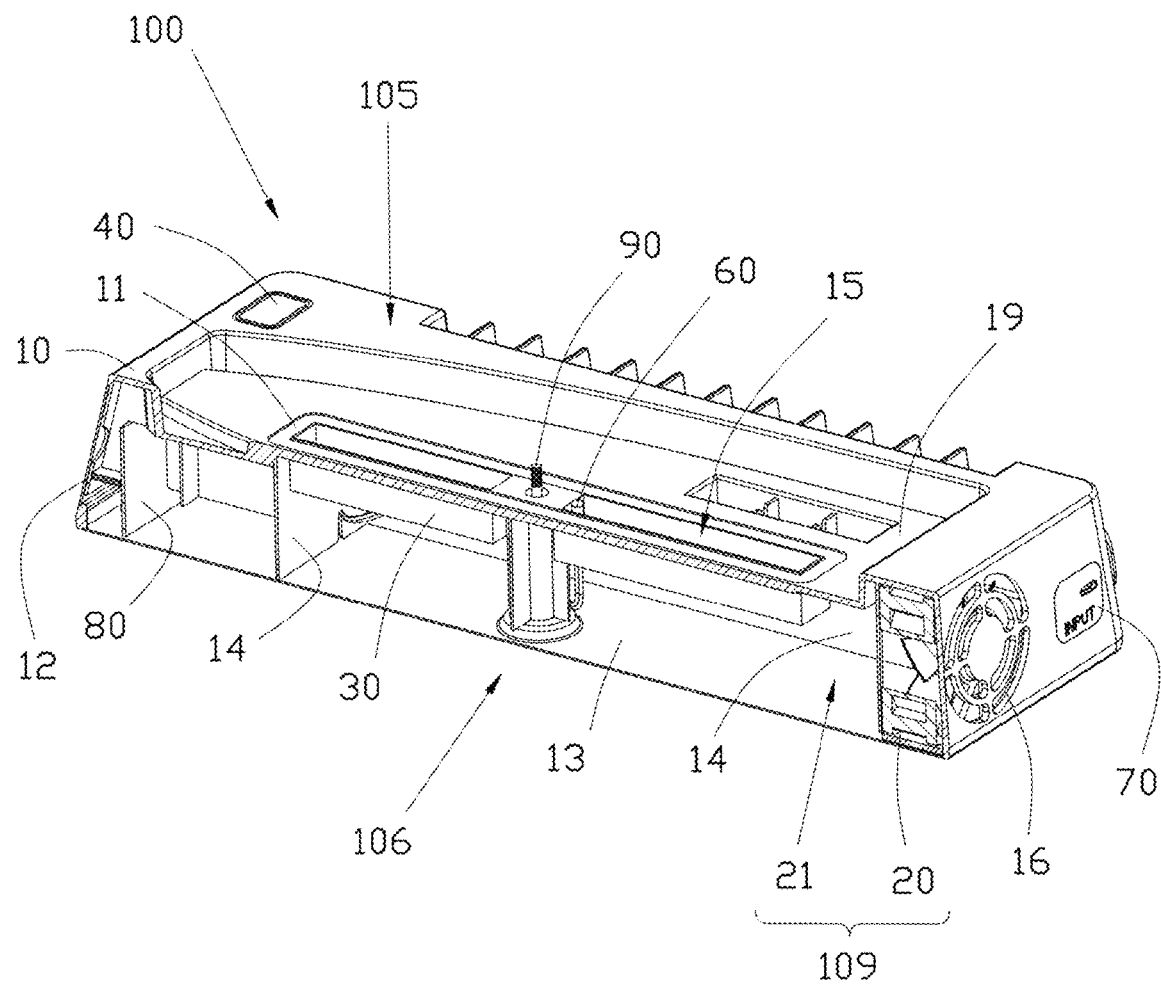
FIG. 3 is a sectional three-dimensional diagram schematically showing the first embodiment of the game console storage base according to the present disclosure.
Figure 4:
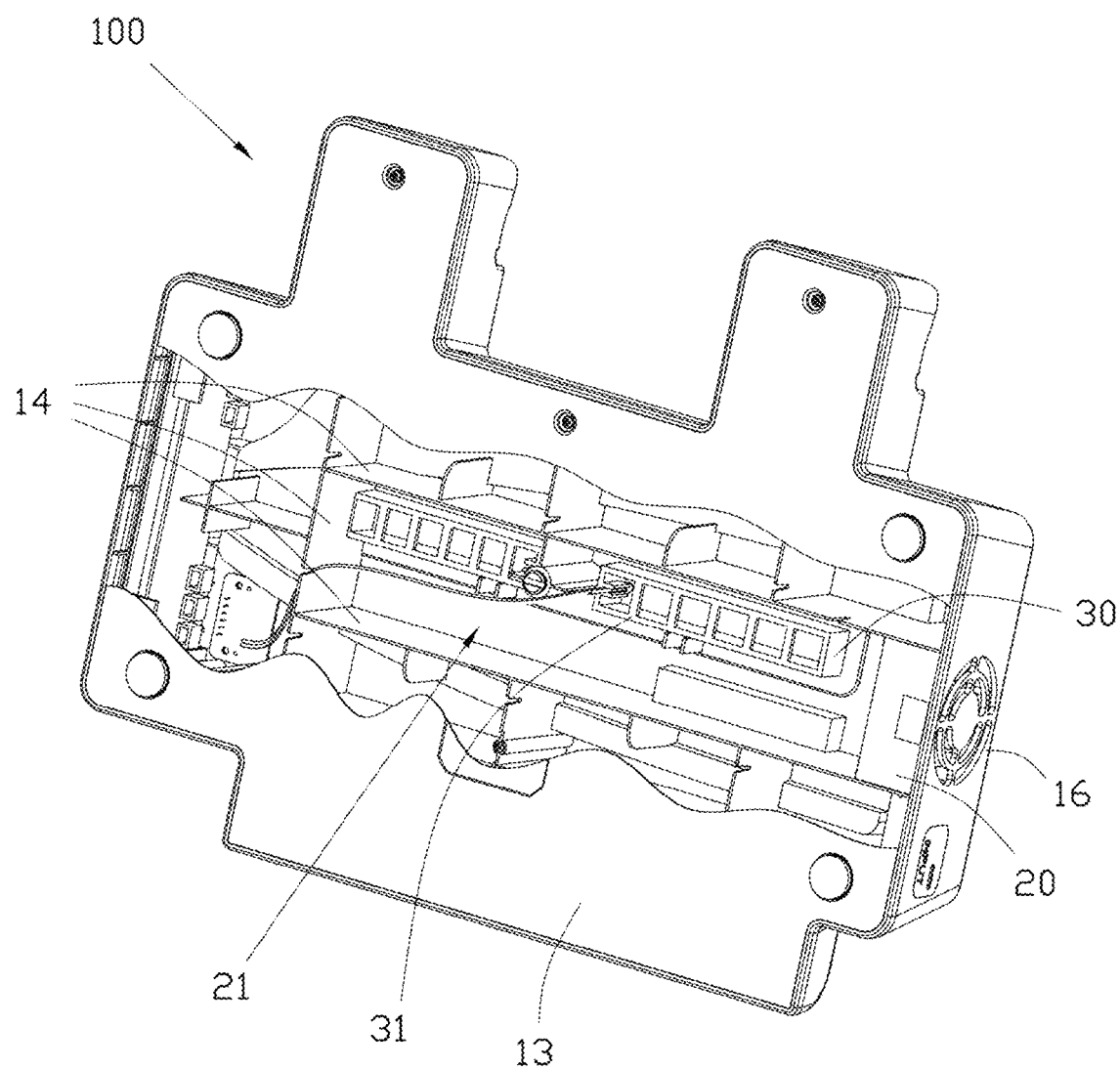
FIG. 4 is a partial schematic diagram showing an internal structure of a housing of the game console storage base shown in FIG. 1, but viewed from a bottom surface of the game console storage.

Preferably, inside the housing 10, one or more baffle plates 14 for narrowing the heat dissipation channel 21 may also be included. For example, as shown in FIGS. 3 and 4, three baffle plates 14 are provided. The three baffle plates 14 are erected from the bottom surface 106 of the housing 10 to the top surface 105 of the housing 10. The three baffle plates 14, the top surface 105, the first side surface 101 and the bottom surface 106 of the housing 10 enclose a tunnel-shaped space which serves as the heat dissipation channel 21. One of the three baffle plates 14 is opposite to the first side surface and is formed at an end, far away from the first side surface, of the air inlet 15, and the other two baffle plates are opposite to each other with the air inlet 15 being sandwiched therebetween. One or more baffle plates 14 can narrow the space in which air flows, such that an appropriate amount of heat is more easily carried out of the housing. However, it can be understood that, the number and positions of the baffle plates 14 are not limited to the structures shown in FIGS. 3 and 4, and can be appropriately changed according to actual needs. For example, each baffle plate 14 may be constituted by a flat plate, and may also be constituted by a curved plate, and the one or more baffle plates 14 may also include both a flat baffle plate 14 and a curved baffle plate 14. In addition, one baffle plate 14 may be a continuous and integrated baffle plate 14, and in this way, the one baffle plate 14, the first side surface 101, the top surface 105 and the bottom surface 106 enclose and form the heat dissipation channel 21. In addition, it is also possible that multiple baffle plates 14 and the first side surface 101 together enclose and form a polygon with sides formed thereby, to form the heat dissipation channel 21, which is formed into a polygon in a top view. Therefore, the inside of the game console 200 is only communicated with the heat dissipation channel 21 in the housing 10, and the heat dissipation channel 21 provides a tunnel-shaped airflow channel for air, and air can be quickly carried out of the air outlet 16 via the first fan 20, thereby suppressing accumulation of heat in the internal space, and improving the heat dissipation effect.

In addition, in order to centralize air entering from the air inlet 15 of the housing 10, preferably, an air collection part 30 is arranged at the air inlet 15. The air collection part 30 is like a tub, open at top and bottom, extending towards the inside of the housing 10 from the air inlet 15, such that air carrying heat from the game console 200 enters the inside of the housing 10 in a manner of being centralized to the middle of the housing 10 by the air collection part 30, thereby reducing diffusion of air in the internal space of the housing 10, and improving the heat dissipation effect. However, it can be understood that the air collection part 30 may be omitted.

In addition, storage parts are arranged at two opposite side surfaces of the housing 10 in a width direction, that is, the third side surface 103 and the fourth side surface 104 in FIG. 1, etc. For example, as shown in FIG. 1, an optical disc storage part 17 can be formed in the third side surface, and a handle storage part 18 can also be formed in the fourth side surface in a manner of protruding outwards. The optical disc storage part 17 is provided with a plurality of slots 7, and the plurality of slots 7 are arranged along a long side of the game console storage base 100 to store game optical discs. A groove is formed in the handle storage part 18 to store a handle. In addition, a charging part 50 may also be provided inside the handle storage part 18, and a charging terminal or a charging interface is provided inside the charging part 50. Therefore, the game console storage base 100 of the present disclosure can not only dissipate heat from the game console 200 stored thereon, but also can charge the handle stored thereon.

In addition, the housing 10 can also include an interface part 70 including at least any one of a USB interface or the like configured to charge an external electronic device, and an external power interface configured to charge the game console storage base 100.

[Modification of the First Embodiment]

In addition, the first fan 20 in the heat dissipation unit 109 may also be arranged close to the second side surface 102 on an opposite side with respect to the first side surface 101. Through blowing air to the heat dissipation channel 21 by the first fan 20, an airstream flowing from the air inlet 15 to the air outlet 16 is provided, such that heat in the game console storage base 100 is rapidly discharged.

Figure 5:
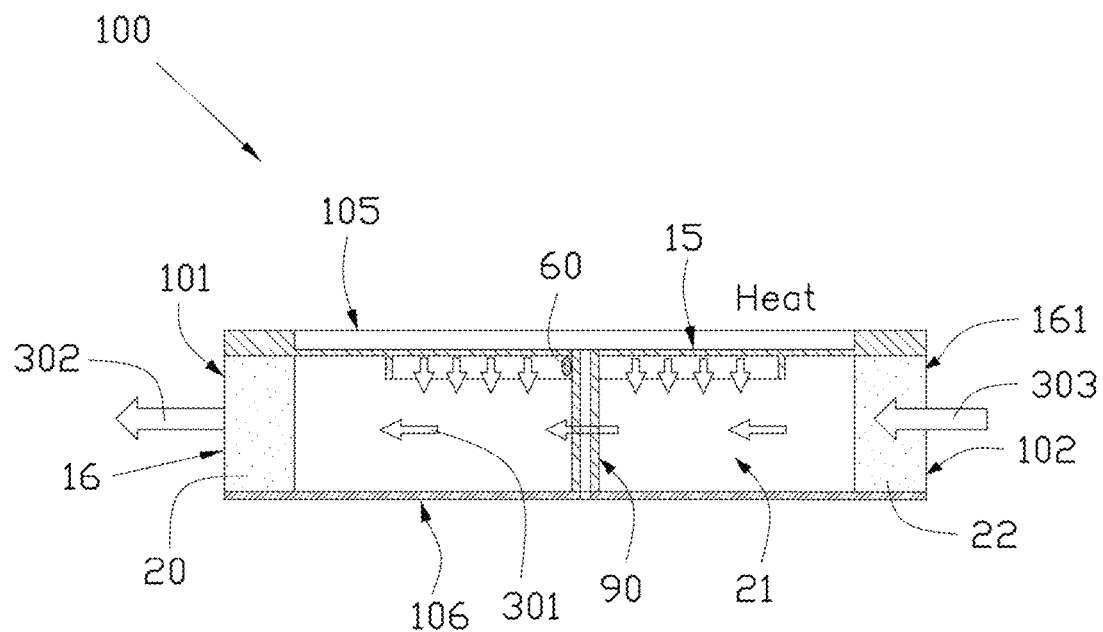
FIG. 5 is a schematic diagram showing a modified embodiment of the first embodiment of the game console storage base according to the present disclosure.
Figure 6:
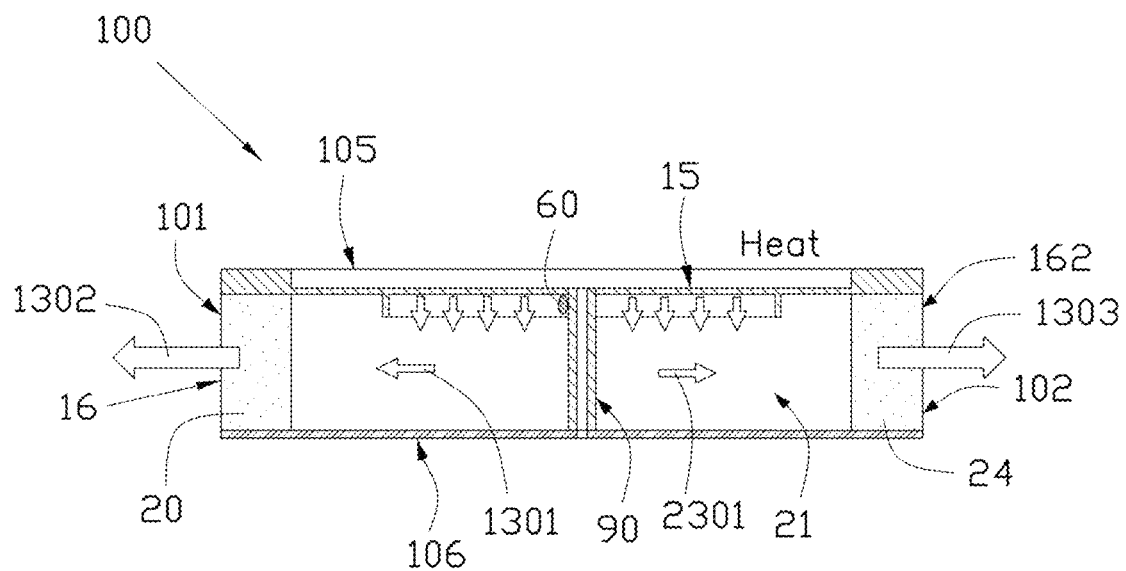
FIG. 6 is a schematic diagram showing the modified embodiment of the first embodiment of the game console storage base according to the present disclosure.

In addition, the heat dissipation unit 109 can include one or more first fans 20. In addition, other side surfaces, except the first side surface 101, of the four side surfaces 101-104 in the above embodiment are configured to be closed, so as to provide, in the internal space of the housing 10, a relatively closed airflow channel for air. However, the present disclosure is not limited thereto. For example, the second side surface 102 may also be non-closed as shown in FIGS. 5 and 6. Specific configuration of the heat dissipation unit 109 is described specifically as follows.

For example, as shown in FIG. 5, the heat dissipation unit 109 includes an air inlet 15, a first air outlet 16, a second air outlet 161, a first fan 20 and a second fan 22. The first air outlet 16 is formed on the first side surface 101, the second air outlet 161 is formed on the second side surface 102, the first fan 20 is arranged close to the first air outlet 16, that is, the side of the first side surface 101, so as to provide, in the heat dissipation channel 21, airstreams 301 flowing from the air inlet 15 towards the first air outlet 16, and the second fan 22 (hereafter also called a heat dissipation fan) is arranged close to the second air outlet 161, that is, the side of the second side surface 102, to provide, in the heat dissipation channel 21, airstreams 301 flowing from the air inlet 15 towards the second air outlet 161. In this way, Directions of the airstreams 302, 303 is kept consistent relative to directions of hot air 301 exhausted out of the game console, as a result, heat in the heat dissipation channel 21 can be further rapidly carried out of the housing 10, and the heat dissipation effect is further improved.

In addition, the heat dissipation unit 109 may also, for example as shown in FIG. 6, include an air inlet 15, an air outlet 16, an air suction port 162, a first fan 20 and a third fan 24. The air outlet 16 is formed on the first side surface 101, the air suction port 162 is formed on the second side surface 102, the first fan 20 is arranged close to the air outlet 16, that is, the side of the first side surface 101, to provide, in the heat dissipation channel 21, airstreams 1301 flowing from the air inlet 15 towards the air outlet 16, and the third fan 24 (hereafter also called a heat dissipation fan) is arranged close to the air suction port 162, that is, the side of the second side surface 102, to provide, in the heat dissipation channel 21, airstreams 2301 flowing from the air suction port 162 towards the air outlet 16. In this way, directions of the airstreams 1302, 1303 is kept consistent relative to directions of hot air 1301, 2301 exhausted out of the game console, as a result, heat in the heat dissipation channel 21 can be further rapidly carried out of the housing 10, and the heat dissipation effect is further improved.

Figure 10:
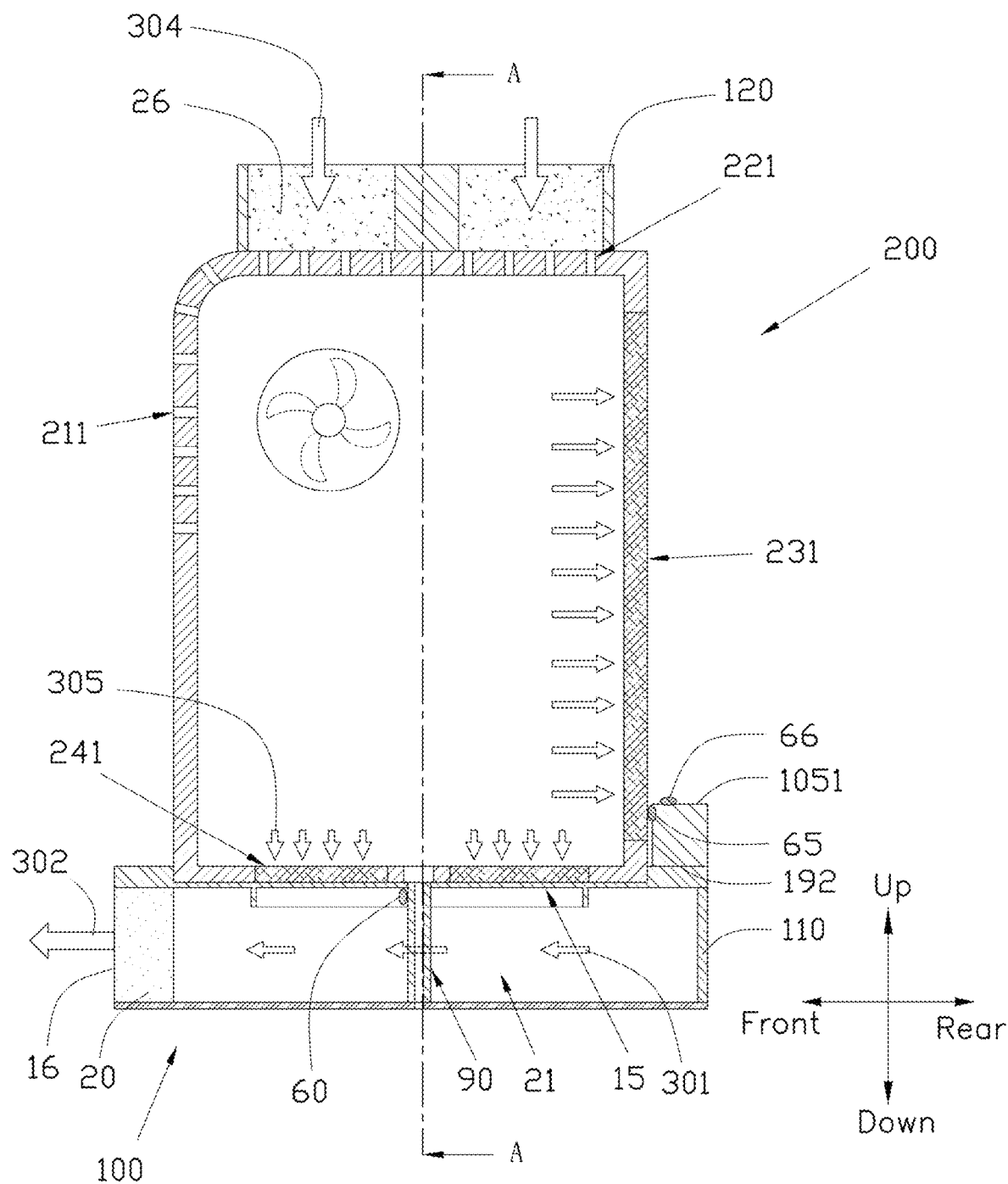
FIG. 10 is a schematic diagram showing yet another installation example of a game console and the first embodiment of the game console storage base according to the present disclosure.
Figure 11:
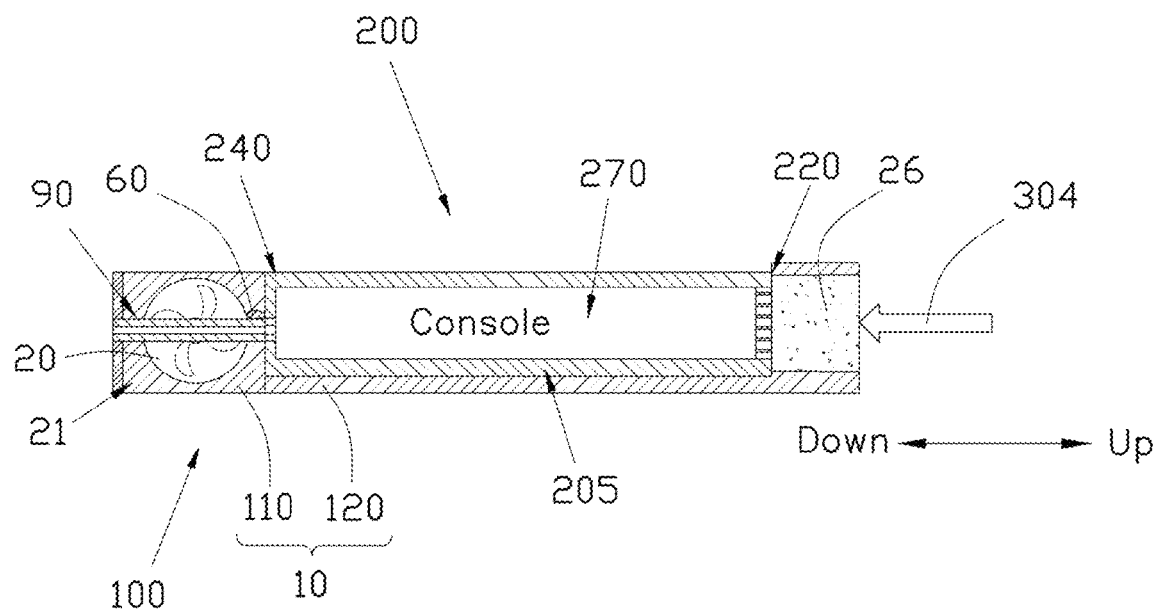
FIG. 11 is a schematic diagram showing an installation example of a game console and the modified embodiment of the game console storage base according to the present disclosure, viewed along the plane A-A indicated in FIG. 10.
Figure 12:
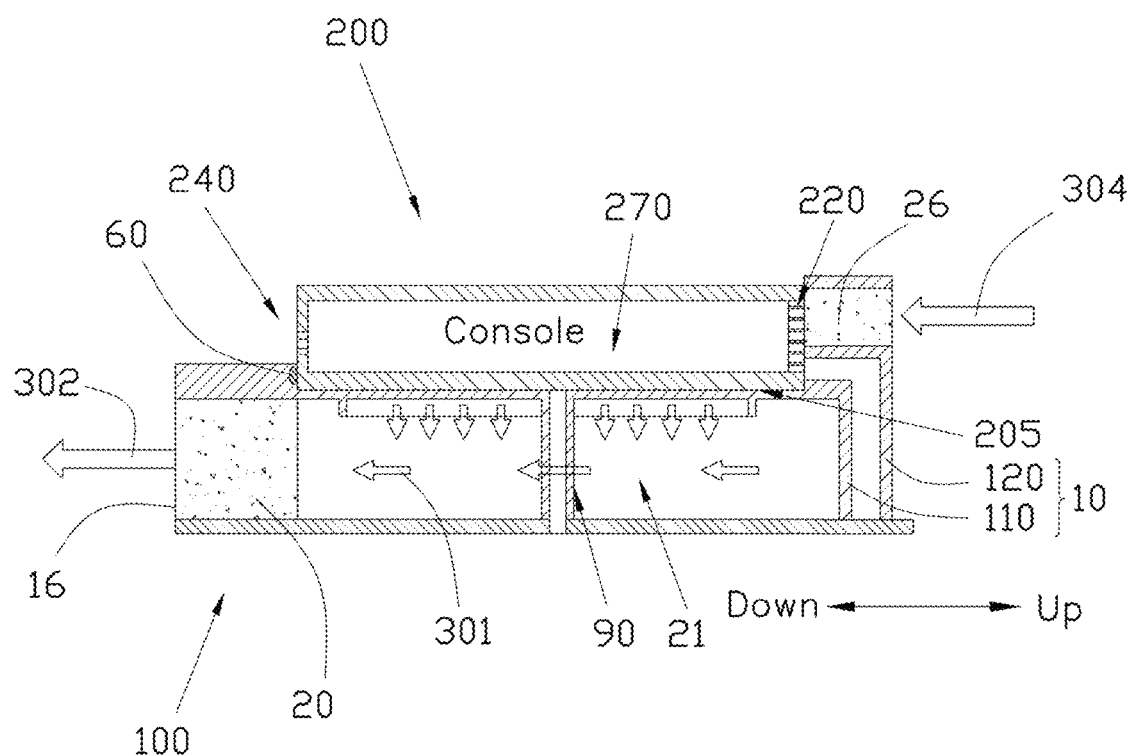
FIG. 12 is a schematic diagram showing another installation example of a game console and the modified embodiment of the game console storage base according to the present disclosure.

In addition, the game console storage base 100 can further include a fourth fan 26 (hereafter also called a heat dissipation fan) and an installation part 261 for fixing the fourth fan 26 (refer to FIGS. 10-12). The fourth fan 26 is arranged to be corresponding to a surface, which is provided with air inlet holes, of the game console 200, to provide extra airstreams 304 whose directions is kept consistent relative to the directions of airstreams (also called inlet air) 305 inside the game console flowing into the game console 200, thereby improving the heat dissipation effect.

Installation Example of the First Embodiment

A game console 200 of Sony PS5 is used as an example below to describe some examples of the installation manner of the game console 200 and the game console storage base 100 of the present embodiment.

Figure 13:
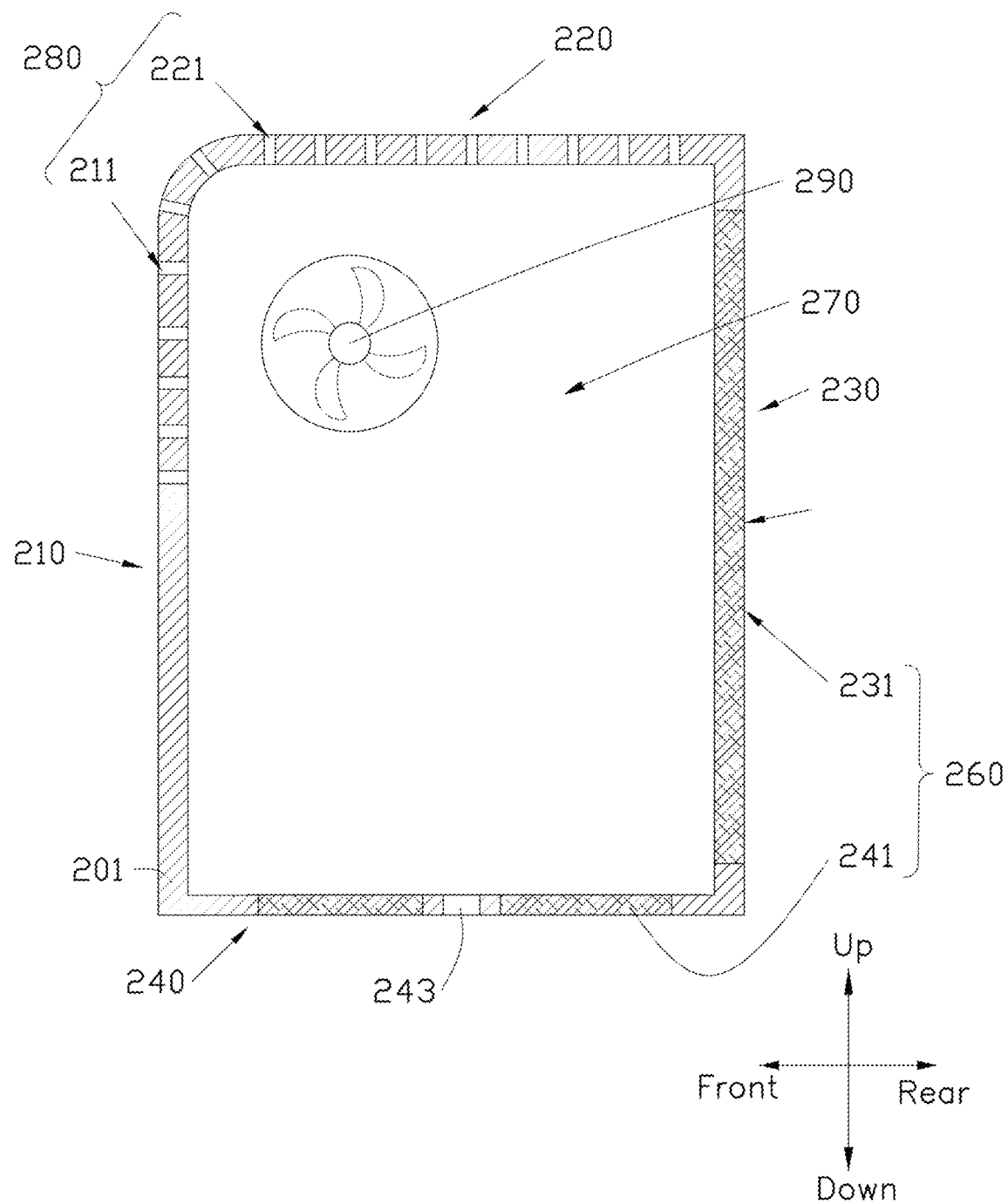
FIG. 13 is a schematic diagram showing an example of a game console applicable to a game console storage base according to the present disclosure.

Firstly, rough configuration of the game console 200 is described. As shown in FIG. 13, a top surface 220 of the game console 200 is also provided with a plurality of air inlet holes 221 for air intake; a back surface 230 of the game console 200 is generally provided with an external power interface and a data transmission interface, etc., and is also provided with a plurality of heat dissipation holes 231 configured to discharge heat inside the game console 200; a bottom surface 240 of the game console 200 is provided with a plurality of heat dissipation holes 241 and a fixing hole 243; the plurality of heat dissipation holes 241 are also configured to discharge heat inside the game console 200, and the fixing hole 243 is formed by penetrating through the housing 201 at the bottom of the game console 200, to fix the game console 200; a fan 290 for heat dissipation is arranged in the interior of the game console 200, thereby forming a console heat dissipation channel 270 of flowing from a plurality of air inlet holes 211 and a plurality of air inlet holes 221 towards a plurality of heat dissipation holes 231 and a plurality of heat dissipation holes 241. Therefore, the game console 200 generally includes two air inlet surfaces provided with air inlet holes 211 and 221 and two heat dissipation surfaces provided with heat dissipation holes 231 and 241.

When the game console 200 is stored in game console storage base 100, the game console can be stored in the accommodation groove 19 in such a manner that the bottom surface 240 is in contact with the game console storage base 100, the game console can also be stored in the accommodation groove 19 in such a manner that the back surface 230 is in contact with the game console storage base 100, or the game console can be stored in the accommodation groove 19 in such a manner that one side surface 250 is in contact with the game console storage base 100. However, no matter which part is in contact with the game console storage base 100 when the game console is stored, through appropriate design, the game console storage base 100 allows the game console 200 to be stored vertically, and also allows the game console 200 to be stored horizontally.

In addition, in order to prevent the game console 200 from titling when the game console is vertically stored for example, a fixing part 90 can be arranged in the accommodation groove 19. The fixing part 90 includes a fastener such as a screw and a base for supporting the fastener. By connecting and tightly locking the fastener and the fixing hole 243 of the game console 200, the game console 200 can be fixed in the game console storage base 100 by means of the bottom surface 240. In embodiments of FIG. 1, etc., the fixing part 90 corresponds to the fixing hole 243 arranged in the center of the bottom surface 240 of the game console 200, and is arranged in the center of the accommodation groove 19 and is in the air inlet 15, such that two air inlets 15 are formed, extending along a length direction of the housing 10. However, the present disclosure is not limited thereto. The fixing part 90 may also be not arranged in the center of the accommodation groove 19 and in the air inlet 15, and changes can be made appropriately according to accommodation postures of the game console 200. For example, in the example of FIG. 12, the fixing part 90 can be arranged in the side wall 192 of the accommodation groove 19, as long as the fixing part 90 can be relatively fixed relative to the bottom surface 240 of the game console 200. In addition, in the case where the game console 200 is stored horizontally, the fixing part 90 can also be omitted.

Figure 8:
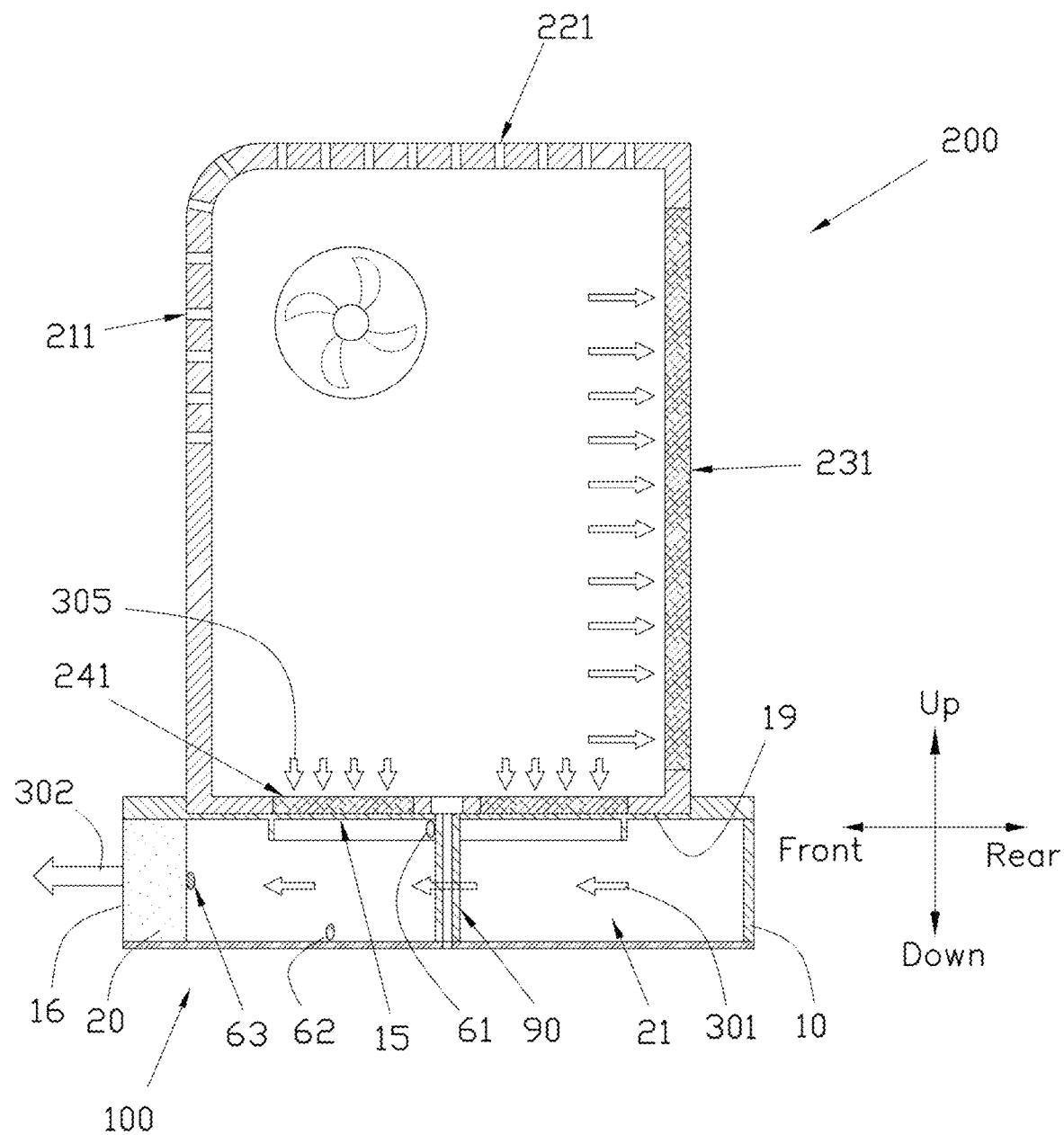
FIG. 8 is a schematic diagram showing an installation example of a game console and the first embodiment of the game console storage base according to the present disclosure.

As shown in FIG. 8, the placement orientation of the game console is shown in the lower right corner. When the bottom surface 240 of the game console 200 is installed and stored towards the top surface 105 of the game console storage base 100, for example, when the game console 200 is stored vertically, the game console 200 can be stably stored by means of the fixing part 90. In addition, through appropriate changes, the game console 200 can be stored horizontally, as long as the console heat dissipation channel 270 of the game console 200 is communicated with the heat dissipation channel 21 in the housing 10. In addition, a gasket 11 surrounding the air inlet 15 can be arranged on the top surface 105 of the housing 10 (refer to FIG. 1, etc.). As an example, the gasket 11 can be formed by a sealing material such as rubber. However, it can be understood that in the present disclosure, the gasket 11 can also be omitted.

Figure 7:
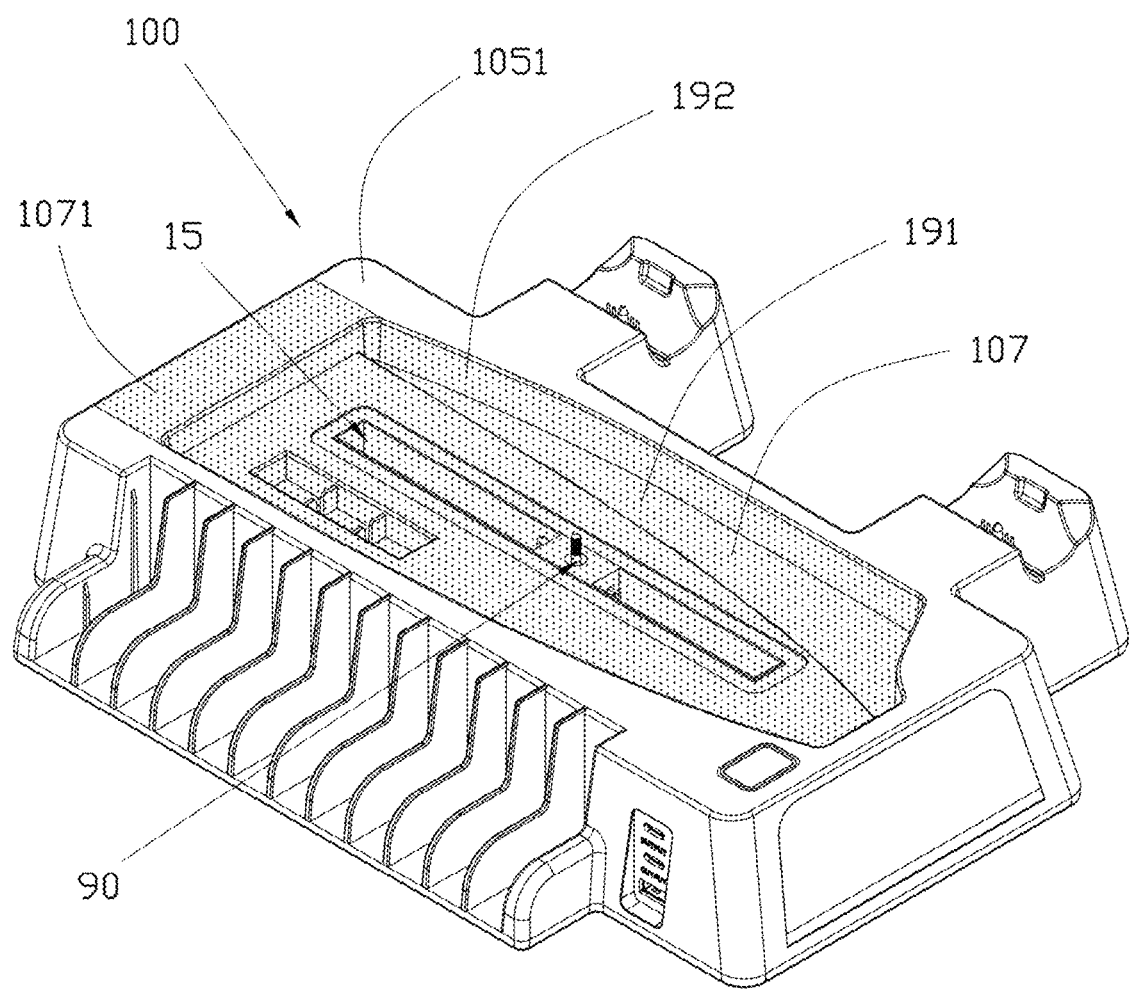
FIG. 7 is a schematic diagram showing a heat flowing region of the first embodiment of the game console storage base according to the present disclosure.

In the case of vertical storage, on the top surface 105 of the game console storage base 100, the bottom wall 191 of the accommodation groove 19 is arranged to contact the bottom surface 240, which is one main heat dissipation surface of the game console 200, a plurality of air inlets 15 can be arranged appropriately corresponding to a plurality of heat dissipation holes 241 of the game console 200, and the side wall 192 of the accommodation groove 19 is close to or contacts the game console 200. Therefore, heat of the game console 200 also flows through the entire accommodation groove 19 and the air inlet 15. Moreover, the groove outer wall 1051 is provided with an outer groove heat flowing region 107a through which heat of the game console 200 also flows. Hot air carrying heat blown out from part of the region of the back surface 230, which is another main heat dissipation surface of the game console 200, flows through the outer groove heat flowing region 107a. Therefore, the top surface 105 is formed with a heat flowing region 107 containing the air inlet 15, the bottom wall 191 and the side wall 192 of the accommodation groove 19 and part of the groove outer wall 1051 as shown in FIG. 7. In other words, the game console storage base 100 can receive, in the heat flowing region 107, heat dissipated by the game console 200.

In examples of FIGS. 1 to 4, the temperature sensor 60 is installed on the base of the fixing part 90, therefore, additional setting of an installation part configured to fix the temperature sensor 60 is avoided, and the fixing part 90 has both functions of fixing the fastener and the temperature sensor 60. In addition, the present disclosure is not limited thereto, and the temperature sensor can be arranged at any position in the heat flowing region 107 of the game console storage base 100, that is, at any of the air inlet 15, the bottom wall 191 and the side wall 192 of the accommodation groove 19, and the outer groove heat flowing region 107a of the groove outer wall 1051. In the case where the temperature sensor is arranged at the bottom wall 191 or the side wall 192, a mounting groove or a hole may be formed at a position where the temperature sensor 60 is installed, to avoid that the temperature sensor 60 hinders installation of the game console 200 into the accommodation groove 19. In addition, in examples of FIGS. 1 to 4, one temperature sensor 60 is arranged in the air inlet 15. However, the present embodiment is not limited thereto, and a plurality of temperature sensors 60 may be arranged.

In addition, the temperature sensor 60 may also be arranged at other positions in the heat dissipation channel 21. As shown in FIG. 8, the temperature sensor 60 can be at least any one of a first temperature sensor 61 installed in the air inlet 15, a second temperature sensor 62 arranged in the bottom surface 106 and a third temperature sensor 63 arranged close to the air outlet 16, and the first to third temperature sensors 61-63 are connected with the control circuit 80. Preferably, only one first temperature sensor 61 is utilized to detect the temperature of the game console 200, so that the heat dissipation condition of the game console is conveniently acquired by a user through display by the display part 40, or the heat dissipation efficiency of the game console by the game console storage base 100 is adjusted through control by the control circuit 80.

Figure 9:
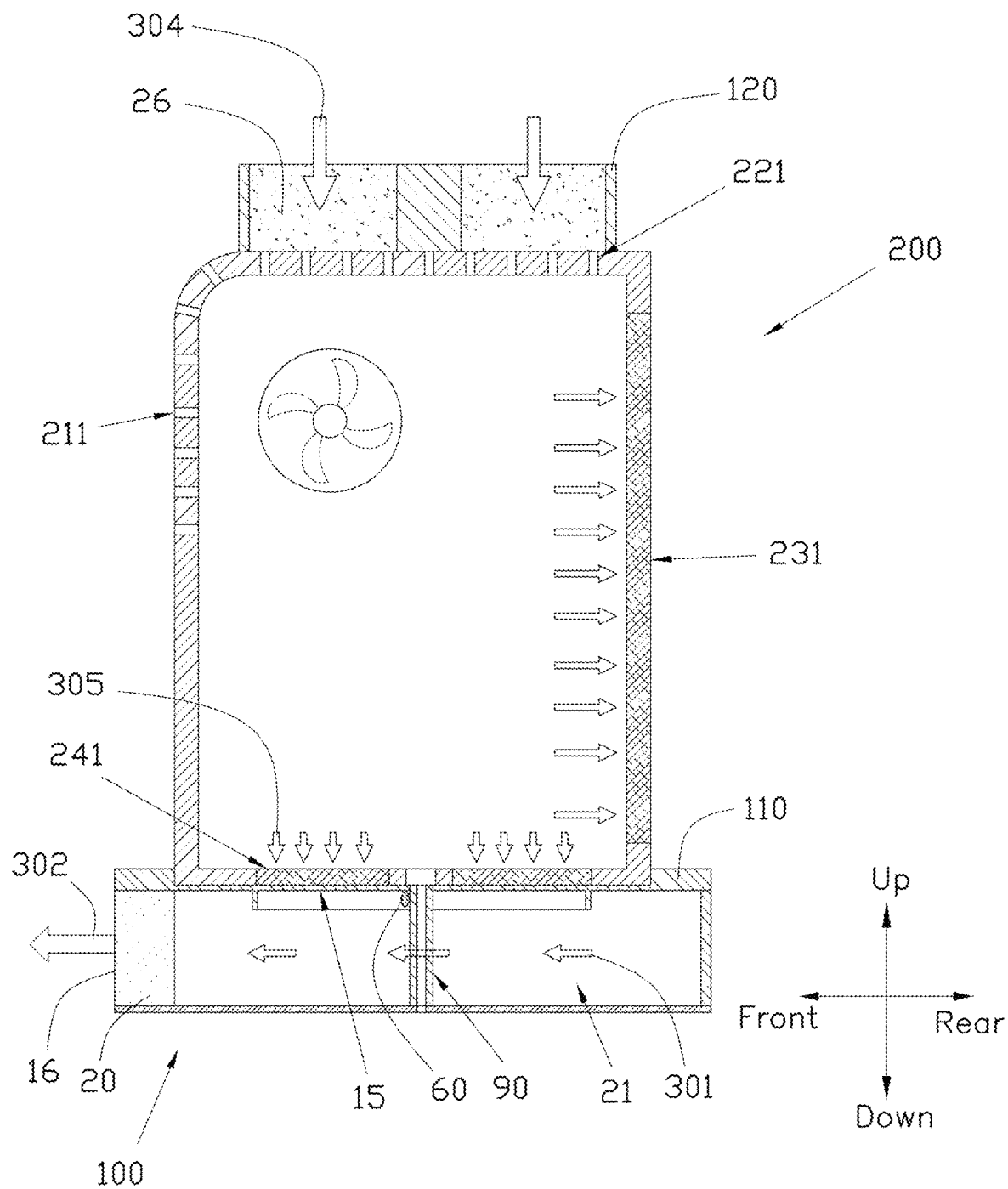
FIG. 9 is a schematic diagram showing another installation example of a game console and the first embodiment of the game console storage base according to the present disclosure.

In addition, also as shown in FIG. 9, a temperature sensor which is arranged to be opposite to part of the back surface 230 of the game console 200 can further be included. For example, at least any one of a fifth temperature sensor 65 arranged on the side wall 192 and a sixth temperature sensor 66 arranged on the groove outer wall 1051 is included, and the first, fifth and sixth temperature sensors 61, 65, 66 are connected with the control circuit 80. The fifth and sixth temperature sensors 65, 66 are arranged corresponding to a heat dissipation surface, for example, the back surface 230, of the game console, such that the fifth and sixth temperature sensors 65, 66 can sense heat dissipated from the heat dissipation holes 231 of the back surface 230.

In addition, in the case where the temperature sensor 60 includes a plurality of temperature sensors, the control circuit 80 increases the heat dissipation efficiency of the heat dissipation unit 109 when the temperature detected by any one of the plurality of temperature sensors reaches a first threshold indicating overheating of the game console 200, and reduces the heat dissipation efficiency of the heat dissipation unit 109 when the temperatures detected by all the plurality of temperature sensors drop to a second threshold indicating that heat dissipation of the game console 200 is completed.

In addition, in the case where a fourth fan 26 is further included, the game console 200 can be stored horizontally, and can also be stored vertically. For example, the fourth fan 26 is opposite to the air inlet holes 221 of the top surface 220 of the game console 200, and blows air towards the inside of the game console 200, so as to improve the heat dissipation efficiency of the game console 200. Moreover, the air inlet 15 is communicated with the heat dissipation holes 241 of the bottom surface 240 of the game console 200, and brings heat inside the game console 200 into the game console storage base 100. The fourth fan 26 is communicated with an air flowing-in end of the console heat dissipation channel 270 in the game console 200, and at least the first fan 20 is communicated with an air flowing-out end of the console heat dissipation channel 270 in the game console 200, so as to achieve rapid heat dissipation of the game console 200. Moreover, as long as the fourth fan 26 is connected with the flowing-in end of the console heat dissipation channel 270 in the game console 200, and the heat dissipation unit 109 in the housing 10 is connected with the flowing-out end of the console heat dissipation channel 270, other configuration can be changed according to actual needs.

In addition, in addition to a first housing 110 in which the heat dissipation channel 21 is arranged, the housing 10 of the game console storage base 100 further includes a second housing 120 for fixing the fourth fan 26. The second housing 120 may be a clamping piece to be clamped on the game console 200, and may also be a supporting piece which is arranged on one surface to support the fourth fan 26. In addition, the second housing 120 may be integrated with the first housing 110, or they may be connected with each other or may be separated from each other.

In addition, in FIGS. 10 and 11, the temperature sensor arranged in the heat dissipation channel 21 includes any one of the above-mentioned first to third temperature sensors 61-63, to detect heat dissipated from the bottom 240 of the game console 200. In addition, the temperature sensor can also include any one of the fifth temperature sensor 65 which is opposite to part of the back surface 230 of the game console 200 and which is arranged on the side wall 192 and the sixth temperature sensor 66 arranged on the groove outer wall 1051.

In addition, the game console 200 can also be stored horizontally as shown in FIG. 12, such that the game console is stored in the accommodation groove 19 in such a manner that one side surface 250 is in contact with the game console storage base 100. In this case, the air inlet 15 is connected with the side surface 250 of the game console 200, to allow entrance of heat dissipated from the side surface 250. The temperature sensor in the heat dissipation channel 21 can include any one of the above-mentioned first to third temperature sensors 61-63. In addition, the temperature sensor can also include any one of the fifth temperature sensor 65 which is opposite to part of the back surface 230 or the bottom surface 240 of the game console 200 and which is arranged on the side wall 192 and the sixth temperature sensor 66 arranged on the groove outer wall 1051. In addition, the fixing part 90 may also be arranged according to the horizontal posture of the game console 200, in such a manner that the fixing part 90 for fixing the game console 200 is arranged on the side wall 192 opposite to part of the bottom surface 240 of the game console 200, and the temperature sensor 60 is also positioned in the fixing part 90, which can also achieve the same effect as in the case of vertical storage.

In addition, heat dissipation fans can also be used as the first to fourth fans 20, 22, 24, 26 of the present application.

What is claimed is:

1. A game console storage base configured to store a game console, and dissipate heat from the game console, wherein the game console storage base comprises:
   a housing configured to accommodate the game console and comprising an accommodation groove recessed inwardly, and an air inlet disposed in the accommodation groove, wherein the air inlet is configured to facilitate dissipating heat from the game console into an interior of the housing;
   at least one heat dissipation fan arranged in the interior of the housing, wherein the at least one heat dissipation fan discharges heat from the interior of the housing to an external of the housing;
   at least one temperature sensor configured to sense a temperature of the heat dissipated from the game console; and
   a control circuit connected to the at least one temperature sensor and the at least one heat dissipation fan,
   wherein the housing further comprises a fixing part configured for fixing the game console on the game console storage base and disposed in the air inlet, and the at least one temperature sensor comprises a first temperature sensor which is arranged at the fixing part.

2. The game console storage base according to claim 1, wherein the fixing part comprises a first surface adjacent to a first heat dissipation surface of the game console, the first temperature sensor is arranged on the first surface of the fixing part.

3. The game console storage base according to claim 1, wherein the housing further comprises a heat dissipation channel in the interior of the housing and a first air outlet on the housing, the air inlet and the first air outlet communicates with the heat dissipation channel, and the first air outlet communicates to the exterior of the housing, thereby discharging heat to the exterior of the housing.

4. The game console storage base according to claim 3, wherein the at least one heat dissipation fan comprises a first heat dissipation fan arranged in the interior of the housing, and the first heat dissipation fan is configured to provide airstreams flowing into the heat dissipation channel and then to the external of the housing.

5. The game console storage base according to claim 4, wherein the first heat dissipation fan is arranged adjacent to the first air outlet.

6. The game console storage base according to claim 4, wherein the first heat dissipation fan is arranged away from the first air outlet, opposite to the first air outlet, in the interior of the housing.

7. The game console storage base according to claim 4, wherein
   directions of the airstreams formed by the first heat dissipation fan is kept consistent relative to directions of hot air exhausted out of the game console.

8. The game console storage base according to claim 4, wherein
   the game console storage base further comprises a second heat dissipation fan, which is arranged adjacent to air inlet holes of the game console, and directions of airstreams formed by the second heat dissipation fan is kept consistent relative to the directions of inlet air of the game console.

9. The game console storage base according to claim 3, wherein the at least one temperature sensor comprises a second temperature sensor which is arranged adjacent to the first air outlet.

10. The game console storage base according to claim 1, wherein the accommodation groove comprises a bottom wall and a side wall connected with the bottom wall, and the air inlet is located on the bottom wall.

11. The game console storage base according to claim 1, wherein
    the game console storage base further comprises:
    a handle controller charging part configured to charge a handle controller;
    an indication part indicating a charging state of the handle controller and indicating an operating state of the at least one heat dissipation fan; and
    an operation part connected with the control circuit and the at least one heat dissipation fan and configured to control the operating state of the at least one heat dissipation fan.

12. The game console storage base according to claim 1, wherein
    the game console storage base further comprises a display part, wherein the display part is connected with the control circuit and configured to display the value of the temperature detected by the at least one temperature sensor.

13. The game console storage base according to claim 12, wherein
    the game console storage base further comprises an operation part connected with the control circuit and the at least one heat dissipation fan and configured to control an operating state of the at least one heat dissipation fan by the control circuit, and
    when the operation part is operated, the operation part sends instructions to the control circuit, such that the control circuit adjusts a rotational speed of the at least one heat dissipation fan.

14. The game console storage base according to claim 1, wherein
    the first heat dissipation surface of the game console comprises a plurality of heat dissipation holes, and the first temperature sensor is arranged to be adjacent to at least part of the heat dissipation holes.

15. The game console storage base according to claim 1, wherein
    the control circuit is configured to adjust a rotational speed of the at least one heat dissipation fan according to the value of the temperature detected by the at least one temperature sensor, and the higher the value of the temperature, the higher the rotational speed of the heat dissipation fan.

16. The game console storage base according to claim 1, wherein
    the control circuit is configured to: increase the heat dissipation efficiency of the at least one heat dissipation unit when the temperature detected by any one of the at least one temperature sensor reaches a first threshold indicating overheating of the game console; and reduce the heat dissipation efficiency of the at least one heat dissipation unit when the temperature detected by all of the at least one temperature sensor drops a second threshold indicating that heat dissipation of the game console is completed, the first threshold is higher than the second threshold.

17. A game console storage base configured to store a game console, and dissipate heat from the game console, the game console having a plurality of air inlet holes, wherein the game console storage base comprises:
  a housing configured to accommodate the game console, and comprising an air inlet configured to facilitate dissipating heat from the game console into an interior of the housing;
  at least one heat dissipation fan configured for discharging heat of the game console, at least one temperature sensor configured to sense a temperature of the heat dissipated from the game console; and
  a control circuit connected to the at least one temperature sensor and the at least one heat dissipation fan,
  wherein the at least one heat dissipation fan comprises a first heat dissipation fan arranged in the interior of the housing and configured for discharging heat from the interior of the housing to an external of the housing; and a second heat dissipation fan arranged adjacent to the air inlet holes of the game console, and directions of airstreams formed by the second heat dissipation fan is kept consistent relative to directions of inlet air of the game console.

18. A game console storage base configured to store a game console, and dissipate heat from the game console, and mount the game console by a first engagement element configured, wherein the game console storage base comprising:
  a housing configured to accommodate the game console, and comprising an air inlet configured to facilitate dissipating heat from the game console into an interior of the housing;
  at least one heat dissipation fan arranged in the interior of the housing, wherein the at least one heat dissipation fan discharges heat from the interior of the housing to an external of the housing;
  at least one temperature sensor configured to sense a temperature of the heat dissipated from the game console; and
  a control circuit connected to the at least one temperature sensor and the at least one heat dissipation fan; and
  wherein a second engagement element is provided in the air inlet, the second engagement element engages with the first engagement element of the game console to fix the game console into the game console storage base, the at least one temperature sensor comprises a first temperature sensor which is arranged at the second engagement element.

* * * * *